United States Patent [19]

Watanabe et al.

[11] Patent Number: 4,803,446

[45] Date of Patent: Feb. 7, 1989

[54] LOW NOISE MICROWAVE AMPLIFIER

[75] Inventors: Hiroshi Watanabe, Gyoda; Masanobu Suzuki, Nagareyama, both of Japan.

[73] Assignee: New Japan Radio Co., Ltd., Tokyo, Japan

[21] Appl. No.: 82,695

[22] Filed: Aug. 7, 1987

Related U.S. Application Data

[63] Continuation-in-part of Ser. No. 843,948, Mar. 26, 1986, abandoned.

[30] Foreign Application Priority Data

Mar. 28, 1985 [JP] Japan ................................ 60-64795

[51] Int. Cl.[4] ................................................ H03H 5/00

[52] U.S. Cl. .................................. 333/26; 333/21 R; 330/286; 455/328

[58] Field of Search .................. 333/26, 33, 34, 21 R, 333/208, 239, 248, 250, 251; 330/286; 455/327, 328, 325

[56] References Cited

U.S. PATENT DOCUMENTS

| | | | |
|---|---|---|---|
| 3,157,845 | 11/1964 | White | 333/21 R |
| 4,168,478 | 9/1979 | Schuegraf | 333/135 |
| 4,291,415 | 9/1981 | Buntschuh | 333/26 X |
| 4,409,566 | 10/1983 | Patton et al. | 333/26 |
| 4,540,959 | 9/1985 | Saad | 333/21 R |
| 4,679,249 | 7/1987 | Tanaka et al. | 333/26 X |

*Primary Examiner*—Eugene R. Laroche
*Assistant Examiner*—Seung Ham

[57] ABSTRACT

A low noise microwave amplifier wherein a length of a pair of broad or wider walls inside the rectangular waveguide is shortened at least near a portion where a probe for introducing a microwave signal into the amplifying portion is provided. A cutoff frequency of the waveguide near the portion where the probe is provided is raised and comes to 80% to 90% of the lower limit of the frequency of the desired amplification band of the amplifier. An input microwave having a frequency component below the cutoff frequency is prevented from flowing into the amplifier, whereby the generation of oscillation is effectively prevented.

3 Claims, 4 Drawing Sheets

20

43

E 30 40

$V_{GS}$ ...... VOLTAGE BETWEEN GATE AND SOURCE $V_{DS}$ ...... VOLTAGE BETWEEN DRAIN AND SOURCE $\theta_1 \sim \theta_6$ .. MICRO STRIPLINE MATCHING LINE $V_{GS}$ ······ VOLTAGE BETWEEN GATE AND SOURCE $V_{DS}$ ······ VOLTAGE BETWEEN DRAIN AND SOURCE $\theta_1 \sim \theta_6$ ·· MICRO STRIPLINE MATCHING LINE

LOW NOISE MICROWAVE AMPLIFIER

CROSS-REFERENCE TO RELATED APPLICATION

This is a continuation-in-part of application Ser. No. 843,948 (now abandoned) filed on Mar. 26, 1986.

BACKGROUND OF THE INVENTION

The present invention relates to a low noise microwave amplifier wherein a rectangular waveguide is used in its signal input part.

In a conventional microwave amplifier such as a LNA (Low Noise Amplifier) for exclusive use in a television receiver in 4 GHz-band, a down-converter for receiving from DBS (Direct Broadcasting Satellite) in 12 GHz-band, or the like, a rectangular waveguide is used in its signal input part. In such an amplifier, a waveguide microwave mode is converted to a coaxial mode (microstrip mode) by means of a waveguide-to-coaxial converter portion shown in FIGS. 4(*a*) and 4(*b*), and the converted microwave is then amplified by the use of a silicon bipolar transistor or FET (Field Effect Transistor). FIG. 4(*c*) shows a block diagram of the first half portion of an amplifying portion by means of the microwave stripline. In FIGS. 4(*a*) and 4(*b*), numeral 1 is a waveguide standardized in JIS (Japanese Industrial Standard) having a flange 1*a* to be connected to a corresponding waveguide. Numeral 2 is an amplifying portion of which input part is composed of a microstrip line equivalent to a coaxial cable. Numeral 3 is a probe for detecting a microwave (TE wave) in the waveguide 1 and converting it into a TEM wave to transmit the wave into the above microstrip line.

In such an low noise microwave amplifier as described above, an oscillation easily takes place when the gain of the amplifier is set at high level. As main causes of an oscillation in the microwave amplifier, in general, there can be given that the gain of the amplifier is high; the impedance of the previous stage with respect to an input part of the FET is in an unstable region; and there exists an input such as noise power which might become a cause of oscillation, and the like.

FIG. 5 shows a relationship between the frequency and the gain in a low noise microwave amplifier of 4 $GH_z$-band having the above-mentioned construction. The necessary amplifying bandwidth of an output of the amplifier is from $f_L$ (=3.7 $GH_z$) to $f_H$ (=4.2 $GH_z$) in FIG. 5. It is preferable that the amplification occurs within the above range (from $f_L$ to $f_H$) In fact, however, there occurs the amplification below the frequency $f_L$ and/or over the frequency $f_H$. In this example, as shown in FIG. 5, there exists a noise source, at a frequency of 3.4 $GH_z$, of which gain is larger than the desired signal. The noise is considered to generate an oscillation. In order to examine in detail the above causal relation, the relationship between the impedance and the frequency at the first half portion of the amplifier, which is observed from the input part of FET, is investigated. The result is shown in FIG. 6 in the form of a schematic Smith Chart. The impedance generally depends on the frequency because impedance consists of reactance. As is clear from FIG. 6, the frequency of around 3.4 $GH_z$ is just in the unstable operation region shown as a hatched portion A in FIG. 6. It is concluded that the above oscillation is due to this fact. Though it is possible to shift the impedance to the stable region by adjusting the stripline matching lines $\theta_1$, $\theta_2$, and $\theta_3$, the impedance of other frequency also changes and shifts to the above-mentioned unstable region. These matching lines are generally adjusted so as to give the best NF (Noise Figure) at so-called amplifying bandwidth (from $f_L$ to $f_H$). Thus, hitherto, in order to avoid the oscillation, an isolator is provided between the amplifying portion 2 and the waveguide 1 to prevent the oscillation. According to the above isolator, the impedance at the input side of the amplifier is fixed to reduce the effect of fluctuation of the impedance at the input side of the isolator. However, in a method as mentioned above, there are generated problems that the constitution becomes complicated, it costs much to provide the isolator and a reduction of noise figure corresponding to an insertion loss of the isolator is brought about.

Another method is also employable wherein a certain filter is inserted at the input side of the microwave amplifier to eliminate a frequency component below the frequency $f_L$ which is the lower limit of the amplifying bandwidth. In such a case, a reduction of noise figure corresponding to an insertion loss of the filter takes place. In order to prevent the above reduction, the filter is inevitably provided at the following part of the amplifier instead of the input side of the amplifier. In that case, however, the effect of the filter is greatly lessened.

An object of the invention is to provide a low noise microwave amplifier capable of greatly reducing a possibility of oscillation of a microwave amplifier without using an isolator, filter, or the like, even when a device of every impedance is connected to the input part of the converter.

This and other objects of the invention will become apparent from the description hereinafter.

SUMMARY OF THE INVENTION

In accordance with the present invention, a low noise amplifying portion is provided so that a length of a pair of broad or wider walls 43 inside the rectangular waveguide is shortened, that is, a distance between a pair of narrower walls 42 of the rectangular waveguide is narrowed at least near a portion where a probe for introducing a microwave signal into an amplifying portion is provided, whereby a cutoff frequency of the waveguide near the portion where the above probe is provided is raised to come to 80% to 90% of the lower limit ($f_L$) of the frequency of the desirable amplifying bandwidth (from $f_L$ to $f_H$) of the above amplifier.

An input microwave having a frequency component below the cutoff frequency is prevented from flowing into the amplifying portion whereby the generation of oscillation is effectively prevented.

BRIEF EXPLANATION OF THE DRAWINGS

FIG. 1(*b*) is a sectional view of the embodiment of FIG. 1(*a*);

FIG. 1(*c*) is an equivalent circuit diagram of an input side of a first FET.

FIG. 4(*b*) is a sectional view of the converter of FIG. 4(*a*);

FIG. 4(*c*) is an equivalent circuit diagram from waveguide-to-coaxial converter to the first FET;

DETAILED DESCRIPTION

Embodiments of the present invention are explained hereinafter.

Figure 1A:
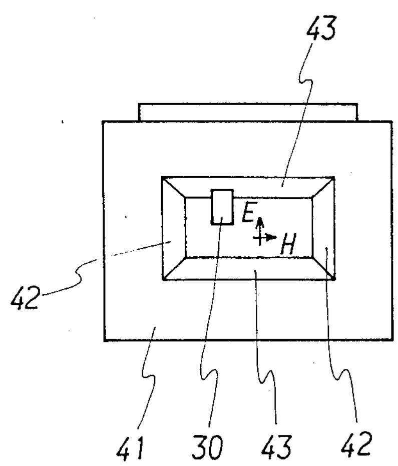
FIG. 1(*a*) is a front view of an embodiment of a low noise microwave amplifier of the present invention.
Figure 1B:
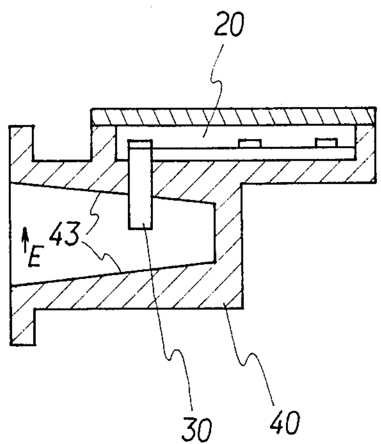
Figure 1C:
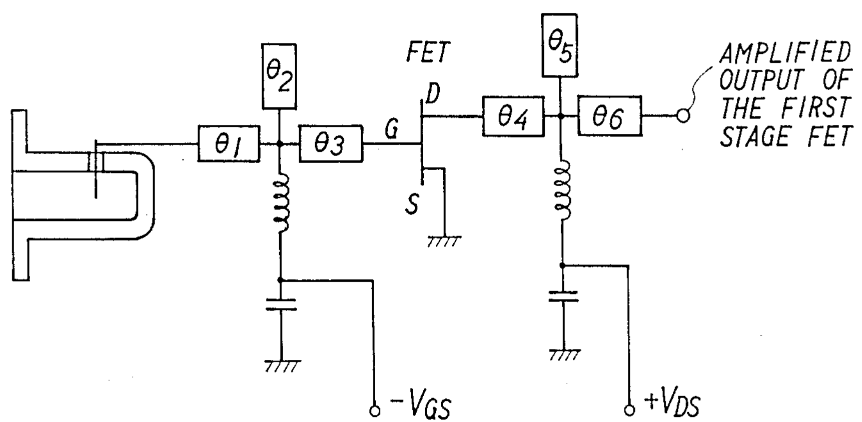
Figure 4A:
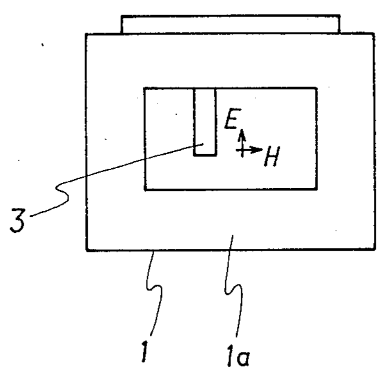
FIG. 4(*a*) is a front view of a conventional low noise microwave amplifier.
Figure 4B:
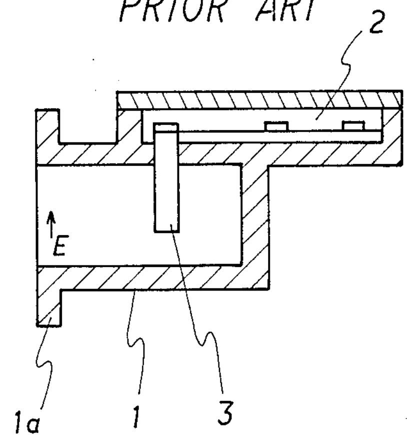
Figure 4C:
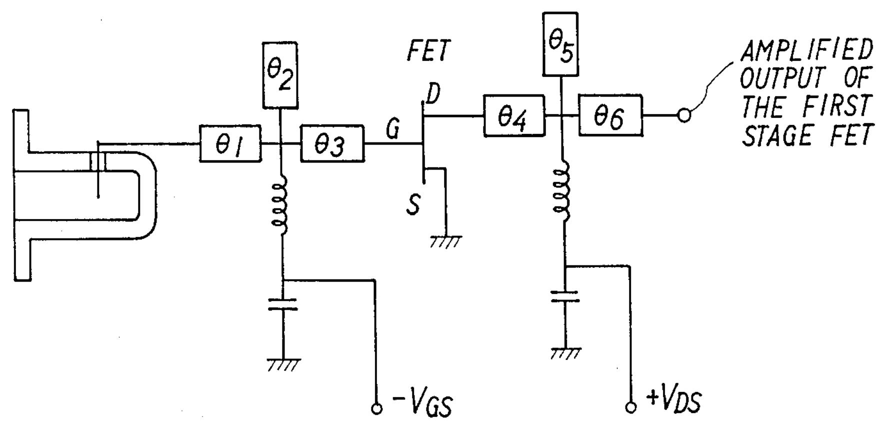
Figure 5:
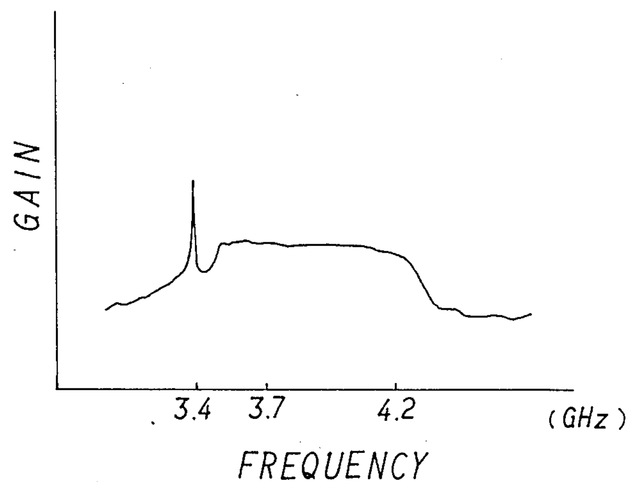
FIG. 5 is a view showing a relationship between the frequency and the gain in the conventional amplifier.
Figure 6:
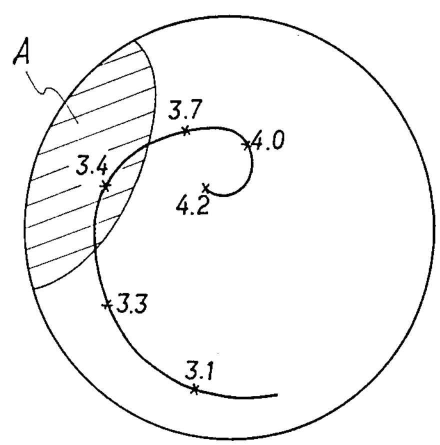
FIG. 6 is a Smith Chart showing an impedance where the impedance is observed from an input side of the first FET in the conventional amplifier.

In FIGS. 1(*a*) and 1(*b*), numeral 40 is a tapered waveguide obtained by narrowing the distance between the walls of the waveguide facing each other at the end portion of a waveguide (JIS WRJ-4). Numeral 41 is a flange to be connected to the corresponding waveguide, numeral 20 is an amplifying portion composed of FET or stripline, and numeral 30 is a probe (antenna) for detecting a microwave (TE wave) in the waveguide 40 and converting it into a TEM wave to transmit the wave into the above-mentioned microstrip line. The amplifying portion 20 includes three FET and the amplification is carried out by three stages. A microstrip matching line is formed on a dielectric plate having a conductor at the back thereof. An equivalent circuit diagram till the first stage FET is shown in FIG. 4(*c*) where $\theta_1$, $\theta_2$, $\theta_3$, $\theta_4$, $\theta_5$ and $\theta_6$ are strip matching lines. The impedance can be adjusted by varying the width or length of the strip matching lines.

We inventors have taken notice of the fact that the conventional amplifier of the above-mentioned type has a noise source at a frequency below the desirable amplifying bandwidth (i.e. from $f_L$ to $f_H$), and has tried to cut off signals of low frequency by narrowing the distance between the narrower walls of the waveguide facing each other. In general, a waveguide has a cutoff frequency. The signal having a frequency lower than the cutoff frequency is perfectly cut off. In also the signal having a frequency higher than the cutoff frequency, however, the value of attenuation of signal increases, in an exponential function manner, as the frequency approaches the cut off frequency. The cutoff frequency of of WRJ-4 in this example is 2.58 $GH_z$. The signal having a frequency higher than 2.58 $GH_z$ attenuates in an exponential manner as the frequency approaches 2.58 $GH_z$. But the value of attenuation near 3.4 $GH_z$, at which a noise source in problem generates, is about 0.38 dB/m. Thus, the sufficient value of attenuation cannot be expected and the amplifier amplifies the signal near the above-mentioned 3.4 $GH_z$, whereby the oscillation occurs. The cutoff frequency is mainly determined by the length or size of the longer side of a waveguide, in other words, by the distance between a pair of narrower walls of a rectangular waveguide. The most suitable size of the waveguide is investigated not only to raise a cutoff frequency but also not to attenuate signals in the desirable amplifying bandwidth (from $f_L$ to $f_H$), as is the case with the insertion of a filter.

Figure 2:
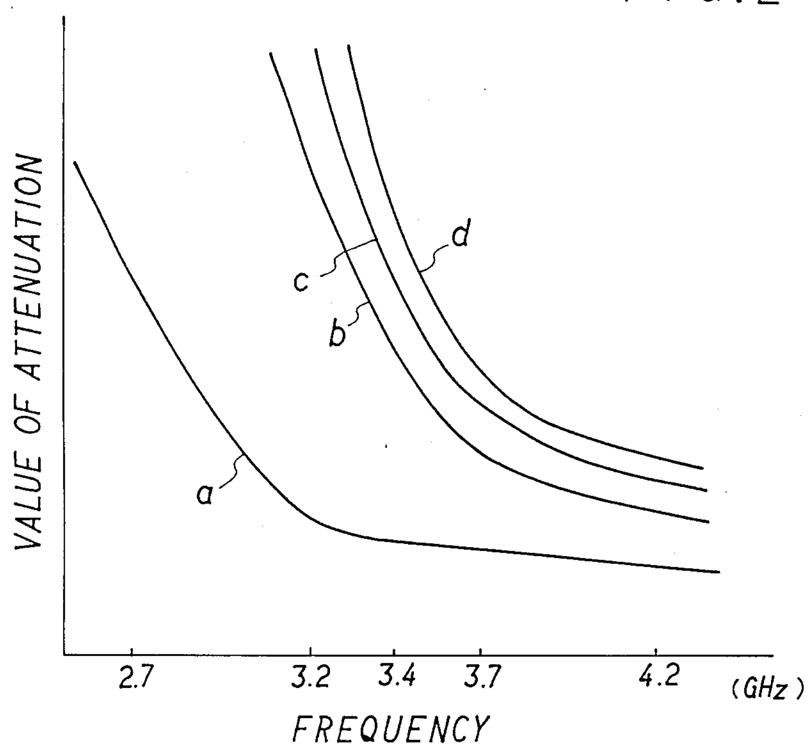
FIG. 2 is a view explaining a relationship between the frequency and the value of attenuation wherein the length of the longer side of a waveguide at a portion where a probe is provided is variously varied, FIG. 3(*a*) is a front view of another embodiment of a low noise microwave amplifier of the present invention.

FIG. 2 shows a relationship between the value of attenuation and the frequency where the distance between a pair of narrower walls of the rectangular waveguide at which the probe 30 is provided is variously varied and the inside of the waveguide is tapered from a flange portion. In FIG. 2, a curved line a shows a relationship between the gain and the frequency of a waveguide WRJ-4 i.e. the distance between a pair of narrower walls of the rectangular waveguide is 58.1 mm. In the case of a curved line b, the above distance at a portion at which a probe is provided is 49.6 mm (i.e. the cutoff frequency of fc=3024 $MH_z$). In the case of a curved line c, the distance is 48.0 mm (fc=3093 $MH_z$), and in the case of a curved line d, the distance is 47.3 mm (fc=3171 $MH_z$). In this explanation (which is based on calculation), there was used a waveguide of 1 m long. However, the actually used waveguide is generally about 5 cm long and there are formed tapered portion, accordingly the parts of the above shortened length are very small. The value of attenuation is, therefore, actually much smaller those shown in FIG. 2. However, the ratio of size can be determined by the relative relationship of the waveguide used in the experiment and the waveguide actually used. As is clear from FIG. 2, the value of attenuation around 3.4 $GH_z$, at which a noise generates, is 0.038 dB in the case of the conventional waveguide (WRJ-4). On the contrary, in the case of the curved line b, there can be obtained a great value of attenuation as much as 0.074 dB (this value amounts to as much as 5 to 10 dB in the observed value because of the critical frequency region). Further, the value of attenuation is 0.032 dB at the desirable amplifying bandwidth $f_L$=3.7 $GH_z$ in the case of the conventional waveguide. But, in the case of the curved line d, the value of attenuation is as small as 0.0645 dB, of which value is as small as can be ignored in comparison with a loss of 0.5 to 1.0 dB when a filter is inserted. That is, by adjusting the distance between the walls of the waveguide at which a probe is provided so as to obtain a cutoff frequency having a frequency of 80 to 90% of $f_L$ which is a lower limit of the desirable amplifying bandwidth (from $f_L$ to $f_H$), unnecessary noise can be cut off and the attenuation in the desirable amplifying bandwidth can be minimized, whereby there can be maintained a good NF characteristic.

Figure 3A:
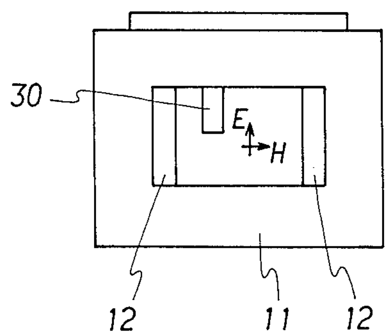
FIG. 3(*b*) is a sectional view of the embodiment of FIG. 3(*a*)
Figure 3B:
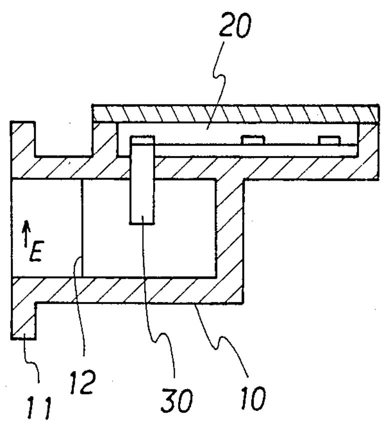

FIGS. 3(*a*) and 3(*b*) show another embodiment of a low noise microwave amplifier of the present invention. In FIGS. 3(*a*) and 3(*b*), instead of narrowing the inside of the waveguide by a tapered portion, a distance between a pair of narrower walls of the rectangular waveguide where a probe is disposed is narrowed by forming a step 12 on each of the narrower-walls. The same effect can be obtained by determining the distance between a pair of narrower walls of the rectangular waveguide as in the example shown in FIGS. 1(*a*) and 1(*b*). In FIGS. 3(*a*) and 3(*b*), numeral 11 is a flange to be connected to the corresponding waveguide.

In the embodiment of FIGS. 3(*a*) and 3(*b*), an additional step can, of course, be formed on a pair of narrower walls of the rectangular waveguide 10.

In the above embodiments, steps 12 and tapers 42 are respectively formed on both a pair of narrower walls. However, a step or a taper can be formed on at least one narrower wall near which the probe is provided. Even in such a case, the distance between narrower walls becomes narrow and the cutoff frequency is raised, hence the same effect as in the above embodiments can be obtained.

According to the present invention, the generation of oscillation can be effectively prevented since the frequency component below a cutoff frequency is prevented from flowing into the amplifier, and the reduction of noise figure corresponding to an insertion loss of an isolator or filter since it is not necessary in the present invention to employ the isolator or filter.

We claim:

1. A 4 GHz-band low noise microwave amplifier comprising:

a converter for converting a microwave input from a waveguide into a coaxial stripline; and an amplifier portion for amplifying an output from the converter, wherein the converter comprises a waveguide having a pair of wider walls and a pair of narrower walls, and a probe provided within a cavity of the waveguide defined by said walls, a distance between a pair of narrower walls is narrowed near a portion where the probe is provided so that the cutoff frequency comes from 80% to 90% of a lower limit frequency of a desirable amplifying bandwith, and the amplifier portion is connected to the probe of the converter, and comprises a microstrip line formed on a substrate made of dielectric and an amplifying element.

2. The low noise microwave amplifier of claim 1, wherein a step is provided on at least one of narrower walls of the rectangular waveguide to narrow a distance between a pair of narrower walls near a portion where the probe is provided.

3. The low noise microwave amplifier of claim 1, wherein a taper is provided on at least one of narrower walls of the rectangular waveguide to narrow a distance between a pair of narrower walls near a portion where the probe is provided.

* * * * *